United States Patent
Gogolla et al.

(10) Patent No.: US 6,950,639 B2
(45) Date of Patent: Sep. 27, 2005

(54) LOCAL OSCILLATOR FOR GENERATING AN HF SIGNAL FOR DIRECT MIXING BY USING AVALANCHE PHOTODIODES

(75) Inventors: Torsten Gogolla, Frastanz (AT); Andreas Winter, Feldkirch (AT); Helmut Seifert, Serba (DE)

(73) Assignee: Hilti Aktiengesellschaft, Schaan (LI)

( * ) Notice: Subject to any disclaimer, the term of this patent is extended or adjusted under 35 U.S.C. 154(b) by 719 days.

(21) Appl. No.: 09/911,272

(22) Filed: Jul. 23, 2001

(65) Prior Publication Data

US 2002/0032014 A1 Mar. 14, 2002

(30) Foreign Application Priority Data

Jul. 31, 2000 (DE) .......................... 100 37 209
Dec. 27, 2000 (DE) .......................... 100 65 353

(51) Int. Cl.[7] .............................................. H04B 1/26
(52) U.S. Cl. ................. 455/196.1; 455/318; 455/323; 455/141
(58) Field of Search .......................... 455/196.1, 197.2, 455/245.1, 318, 323, 324, 141; 250/559.38; 331/1 A, 117 R, 167, 176, 177 V; 342/195; 356/4.01, 5.05, 5.07, 5.09, 5.13, 5.15

(56) References Cited

U.S. PATENT DOCUMENTS

| | | | | |
|---|---|---|---|---|
| 3,694,753 A | * | 9/1972 | Arndt ........................ | 455/191.1 |
| 4,274,736 A | * | 6/1981 | Balmer ....................... | 356/5.13 |
| 4,856,899 A | * | 8/1989 | Iwaoka et al. ............... | 356/454 |
| 5,180,922 A | * | 1/1993 | Hug ........................... | 250/559.38 |
| 5,396,510 A | * | 3/1995 | Wilson ........................ | 356/28 |
| 5,400,130 A | | 3/1995 | Tsujimoto et al. | |
| 5,627,636 A | * | 5/1997 | Nishino et al. ............. | 356/5.05 |
| 5,742,379 A | * | 4/1998 | Reifer ........................ | 356/5.07 |
| 5,812,296 A | * | 9/1998 | Tarusawa et al. ........... | 398/116 |
| 6,052,190 A | | 4/2000 | Sekowski et al. | |
| 6,140,883 A | | 10/2000 | Thomas | |
| 6,240,283 B1 | * | 5/2001 | Holcombe ................ | 455/245.1 |
| 6,288,777 B1 | * | 9/2001 | Froehlich et al. .......... | 356/5.15 |

OTHER PUBLICATIONS

W. K. Kulczyk and Q.V. Davis The Avalanche Photodiode as an Electronic Mixer XP 002040605.
Patent Abstract of Japan No. 58137304.

* cited by examiner

*Primary Examiner*—Benny Tieu
(74) *Attorney, Agent, or Firm*—Sidley Austin Brown & Wood, LLP

(57) ABSTRACT

A local oscillator for use in an optoelectronic distance measurement system for generating a narrow-band HF signal for direct signal mixing with a reception signal generated by an avalanche photodiode (2) from a light signal impinging on the latter, with the depletion layer capacitance ($C_{APD}$) of the avalanche photodiode (2), which varies due to different influences and specimen scatter, is incorporated, as an element which (co-)determines the oscillator frequency, in a controllable HF resonant circuit whose HF resonant frequency is determined, for example, by the adjustable divider ratio of a PLL-circuit (1) which is acted upon by a phase-locked reference oscillator (6) and which controls the capacitance (C) of a capacitance diode (3) connected in parallel with the depletion layer capacitance.

20 Claims, 5 Drawing Sheets

LOCAL OSCILLATOR FOR GENERATING AN HF SIGNAL FOR DIRECT MIXING BY USING AVALANCHE PHOTODIODES

BACKGROUND OF THE INVENTION

1. Field of the Invention

The invention is directed to a local oscillator for generating a narrow-band high-frequency signal (HF signal) for direct signal mixing with a reception signal generated by a reverse-biased avalanche photodiode (APD) from a light signal impinging on the APD.

2. Description of the Prior Art

Avalanche photodiodes (APDs) are used in sensitive optoelectronic measurement systems, among others. For example, optoelectronic measurement of distances up to 100 m with accuracies of a few millimeters has great importance for numerous applications, particularly in the construction industry and in plants engineering. Distance measuring systems of this kind should be as highly dynamic as possible so that very weak, as well as very strong, light reception signals can be processed. This renders superfluous the use of defined target marks on the object whose distance from a reference point is to be determined. The possibility of direct distance measurement at determined surfaces, i.e., without the use of target marks, makes it possible, particularly in the technical fields and industries mentioned above, to reduce manufacturing time and to cut costs while simultaneously reducing manufacturing tolerances.

In order to ensure the required high dynamics and in order to detect very weak measurement signals, the use of sensitive APDs is often unavoidable and is also known in principle in methods and arrangements for high-precision optoelectronic distance measurement. In distance measuring arrangements, in most cases, a preferably sinusoidal intensity-modulated beam of a light source, particularly a laser diode, is directed to a measurement object (EP 0 701 702 B1, DE 196 43 287 A1, U.S. Pat. No. 4,403,857). The intensity-modulated light which is reflected or backscattered from the measurement object is detected by a photodiode. The distance to be measured is given by the phase displacement—relative to the emitted light intensity of the light source—of the light intensity which is modulated in sinusoidal manner and backsctattered from the measurement object. For successful elimination of phase errors depending on temperature, aging and reception power in high-precision distance-measuring and phase-measuring systems, it was suggested in German Patent Application 100 06 493.0, as an improvement of the measurement arrangement according to U.S. Pat. No. 4,403,857, to modulate the light intensities of a main emitter and reference emitter simultaneously with different modulation frequencies and to generate a signal mixture which is based on the use of APDs as main receiver and reference receiver and which contains a signal with the intensity modulation frequency of the main emitter and a signal with the intensity modulation frequency of the reference emitter and a signal with the intensity modulation frequency of the reference emitter. A trouble-free distance measurement with definite distance information is made possible by means of simultaneous measurement of the phases of the two signals generated in this way and the separation of the two phases in an intermediate frequency range.

Since very weak signals must be taken into account with large distances and in technical measurement object surfaces, i.e., without the use of target marks, it is necessary to use sensitive APDs which, for example, in comparison to the PIN photodiodes, cause an additional internal amplification of the photocurrent generated by the incident light power. This inner amplification results from a charge carrier multiplication in the avalanche zone of the APD in which a high electric field strength exists. The charge carriers generated by the incident light are highly accelerated by this field strength, so that, as a result of their high energy state, they release additional charge carriers from the semiconductor material of the APD resulting in an additional amplification of the photocurrent.

A high voltage is required in the blocking direction in order to generate the high electric field strengths in the avalanche zone of the APD. Depending on the type of APD, this voltage ranges from 40 V to 500 V. Typical gain factors of the photocurrents are between 10 and 200. They are highly dependent on the semiconductor material (e.g., Si, InGaAs), the construction of the photodiode, the blocking voltage and the temperature.

A problem, already mentioned, with the type of optoelectronic distance measurement described above, especially on technical or engineering surfaces, is the detection of very weak signals. In this connection, only very slight interference noise and very weak electric crosstalk (e.g., <110 dB) from the light transmitter (laser) to the photodiode receiver may exist in the measuring system.

In order to ensure very weak crosstalk and the least possible in-coupling of external interference fields (radio fields, digital interference), a method of direct signal mixing may be applied in the receiver as is known, for example, from U.S. Pat. No. 4,503,857, cited above, and from a scientific paper by K. Seta, T. Oh'Ishi, "Distance Measurement Using a Pulse Train Emitted from a Laser Diode", Japanese J. of Appl. Physics, Volume 26, No. 10, pages L1690–L1692, October 1987, and as also has been suggested in an especially advantageous modification in German Patent Application 100 06 493.0, also cited above. With this kind of direct mixing, the (preferably) sinusoidal signal of frequency $f_{LO}$ of a local oscillator and an amplitude of >1 V are superimposed on the APD blocking voltage, so that along with the blocking voltage the gain factor M of the APD, i.e., its internal current source, is also modulated. The following equation in a first approximation applies to the APD output current: $i_{APD}(t) = M(t) \cdot i_{FOTO}(t)$, where $M(t)$ is the modulated APD gain depending on time t and $i_{FOTO}(t)$ is the internal photocurrent generated by the light incidence. Because of the nonlinear relationship between the APD gain and the internal photocurrent, a mix product results, i.e., an intermediate frequency signal (IF signal), which oscillates with the frequency difference between the frequency $f_{LO}$ of the local oscillator and the frequency $f_{MESS}$ of the modulated detected light output. The frequency conversion accordingly takes place in the internal current source of the APD. By means of low-pass filtering, higher-frequency components are eliminated. The output signal of the APD, i.e., the IF signal, is (comparatively) low-frequency and can accordingly be further processed without difficulty. Since the mixing process takes place within the chip of the APD, the structural sizes of the mixing arrangement are typically smaller than the utilized modulation wavelength by three or four orders of magnitude. Consequently, external electromagnetic interference and electrical crosstalk are negligible to a great extent. Interference output also leads, in principle, to increased noise. By means of the described step, the noise characteristics are also clearly improved. It is also advantageous that the IF signal arising from the direct mixing is, as a rule, comparatively very low-frequency; e.g., 10 kHz to 100 kHz. No interference is to be expected in this frequency range. Also, parasitic characteristics of other electronic components are negligible at these low frequencies. Since the output signal of the APD is in the IF range, no other high-frequency components are needed in the reception part aside from the local oscillator. Accordingly, production costs as well as power consumption of an optoelectronic distance measuring system outfitted with APDs of this type can also be drastically reduced.

However, this results in a problem which is the object upon which the invention is based: due to the desired—and, in principle, also achievable—low power consumption of the distance measurement device which, in general, is to be operated from a battery which is as small as possible, it is not possible to use known commercially available PLL (Phase Locked Loop) oscillators followed by a 50-ohm HF amplifier for generating the local oscillator signal for frequency mixing or, if so, only with unsatisfactory results. Since an avalanche photodiode is a purely capacitive load but this HF amplifier requires a low-impedance 50-ohm signal termination for stable operation, the amplifier must be provided with compulsory adaptation involving power consumption. At a desired amplitude of, e.g., 2 V, an HF output of 40 mW, for example, would be needed for this purpose. But this can not be achieved with the desired low power consumption.

According to the scientific paper cited above, K. Seta et al., a high-frequency transformer is to be used for signal termination matching of the necessary HF amplifier. In practice, however, this has also turned out to be problematic because only voltage ratios of 1:2 are available for the required high frequencies of the local oscillator signal (e.g., 1 GHz) and, in addition, considerable EMI problems occur due to the use of the transformer.

SUMMARY OF THE INVENTION

The present invention solves the above discussed problems by providing a local oscillator for generating a narrow-band HF signal for direct mixing with a (first) reception signal which is generated from an incident light signal by a reverse biased avalanche photodiode (APD), wherein the depletion layer capacitance of the APD is incorporated in a controllable HF resonant circuit whose resonant frequency forming the HF signal is determined by selective adjustments of a control unit which is acted upon by the reference oscillator.

The invention proceeds from the idea that the depletion layer capacitance of the APD which is used simultaneously as direct mixer is incorporated, as an element which (co-) determines oscillation, in an HF oscillator, especially a PLL-stabilized HF oscillator, wherein the LC oscillator is of primary relevance. Not only does this PLL-stabilized operation ensure the required narrow band of the local oscillator signal which is required for mixing with the reception signal used as measurement signal, but a comparatively high voltage amplitude is also achieved with low power consumption. The adjustable divider ratio of the PLL-circuit together with the frequency of the reference oscillator determines the resonant frequency of the HF resonant circuit.

A particularly advantageous and simple solution results when the HF resonant circuit is constructed as an LC resonant circuit whose resonant frequency is adjusted by means of a capacitance, in particular a capacitance diode, which is connected in parallel or in series with the depletion layer capacitance and which is controllable by means of the PLL-circuit. As an alternative or in addition, it is possible to realize an HF resonant circuit which is controllable with respect to frequency and which lies in parallel or in series with the depletion layer capacitance of the APD by means of a controllable inductance, for example, a controllable transistor acting as inductance.

The HF resonant circuit in which the depletion layer capacitance of the APD is incorporated can also be realized by means of a resonator which is controllable either directly or by the additional use of a controllable capacitance and/or a controllable inductance. Resonators of this type can be, for example, crystals, dielectric ceramic resonators, cavity resonators or line resonators whose equivalent circuits correspond to an LC circuit as is known by one skilled in the art.

BRIEF DESCRIPTION OF THE DRAWINGS

The objects and advantages of the present invention will become more apparent and the invention itself will be best understood from the following detailed description of the preferred embodiments when read with reference to the accompanying drawings, wherein.

DETAILED DESCRIPTION OF THE PREFERRED EMBODIMENTS

Figure 1:
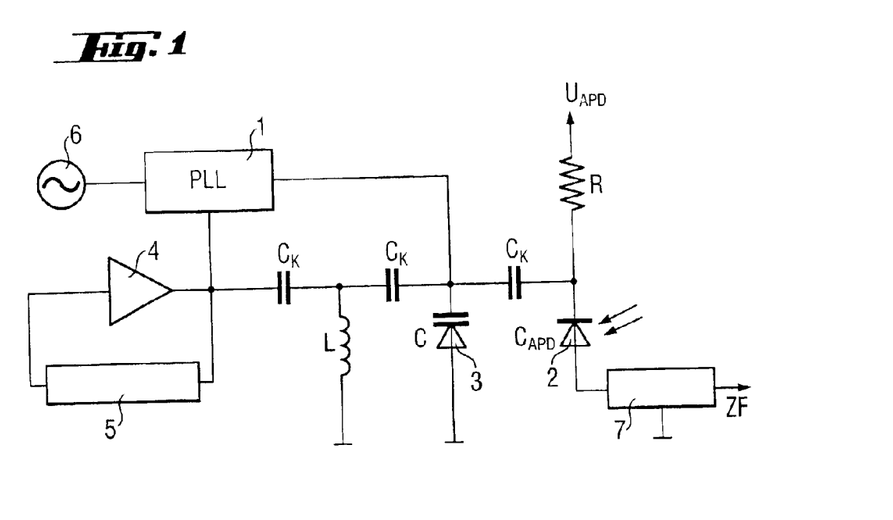
FIG. 1 shows a first embodiment of a local oscillator according to the invention which is realized as a PLL-stabilized LC parallel resonant circuit with a capacitance diode connected in parallel with the depletion layer capacitance of an APD.

In a local oscillator shown in FIG. 1, a high voltage is supplied in the blocking direction, via an ohmic resistance R, to an APD 2 which is used, for example, as a measurement signal receiver. The capacitance C of a capacitance diode 3 and an inductance L are connected in parallel with respect to the high-frequency signal with the depletion layer capacitance $C_{APD}$ of the APD 2. This circuit arrangement forms an LC parallel resonant circuit which is operated in idle at its resonant frequency. The coupling capacitances $C_K$ in the circuit between the cathode-side base points of the APD 2 and the capacitance diode 3 and the inductance L and between the inductance L and the output of an HF amplifier 4 constitute a short circuit for the signal with the resonant frequency. As is known by the person skilled in the art, they serve only to decouple the different DC voltages to be applied to the APD 2, capacitance diode 3 and inductance L. The mixing product which is formed directly in the APD 2 from the reception signal of the APD 2 and the IF signal obtained from the narrow-band HF signal generated by the LC oscillator according to the invention can be tapped on the APD 2 via a low-pass 7. The low-pass 7 can be a capacitive short circuit to ground, for example, for the HF signals, i.e., for the reception signal of the PD 2 and for the local oscillator signal proceeding from the LC oscillator; however, the IF signal can pass unimpeded. Further, the anode of the APD 2 is grounded through the low-pass 7 via a relatively high-impedance resistance, resulting in a DC voltage component of almost 0 volts. Together with a feedback network 5, which will not be described in more detail herein because it is known to the person skilled in the art, the HF amplifier 4, e.g., in the form of a high-frequency transistor, ensures that the LC oscillator is stimulated to oscillate. Further, losses are compensated in this way and an oscillation of constant amplitude is ensured. The capacitance C of the capacitance diode 3 connected in the blocking direction depends on its applied blocking voltage. A small proportion of the LC oscillator signal is supplied, along with the output signal of the amplifier 4, to a PLL-circuit 1 in which the frequency of the LC oscillator signal is reduced, e.g., by a frequency divider, and subsequently compared with respect to phase position to a phase-locked reference oscillator signal generated by a reference oscillator 6. By varying the blocking voltage of the capacitance diode 3, the PLL-circuit 1 regulates the diode capacitance C and therefore the resonant frequency of the LC oscillator, so that there is phase equality between the frequency-reduced LC oscillator signal and the reference oscillator signal. In this case, the resonant frequency of the LC oscillator adopts a reference value which is dependent on the adjustable divider ratio of the frequency divider of the PLL-circuit 1 and on the frequency of the reference oscillator 6. In this connection, it is advantageous when the reference oscillator 6 is the common master oscillator of the entire system, that is, particularly and by way of example, the optoelectronic distance measurement arrangement.

It is important for the invention that the resonant frequency of the LC oscillator is only dependent on the freely selectable divider ratio of the PLL-circuit 1 and on the frequency of the reference oscillator 6. In particular, it does not depend on the depletion layer capacitance $C_{APD}$ of the APD 2 which can involve substantial specimen scatter and is, moreover, dependent on temperature, voltage and reception power. Fluctuations in APD capacitance $C_{APD}$ are compensated completely by the controllable capacitance C of the capacitance diode 3.

Since the phase behavior of the local oscillator signal and accordingly also the phase behavior of the reception signal, particularly the measurement signal, which is obtained via the APD 2 is influenced in the intermediate frequency range by the capacitance variations of the APD 2 which are dependent on temperature and reception power, any distance measurement error caused by this is eliminated at the same time. Accordingly, a defined system state is always adjusted automatically independent from interfering ambient conditions. Other interfering parasitic circuit capacitance is also compensated.

Further, at resonant frequency, the influence of circuit capacitances which limits the low-pass is eliminated by the parallel connection of the inductance L, namely, independent from specimen scatter, temperature, APD blocking voltage and reception power. This leads to an increase in the upper limiting frequency of the circuit.

The defined narrow-band system states described above can be realized at optional frequencies in the frequency lock-in range of the PLL-circuit 1 with the programmable divider ratio of the PLL circuit 1.

Figure 2:
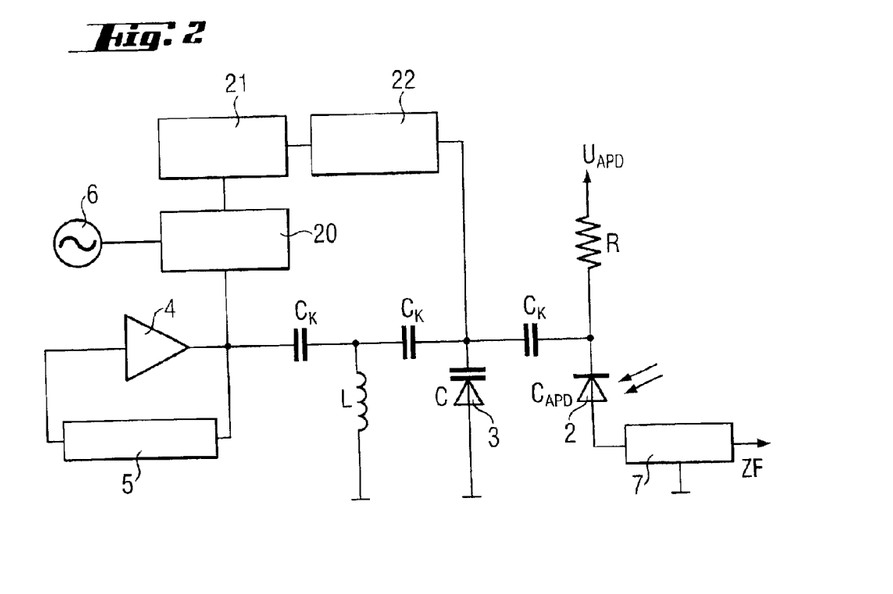
FIG. 2 shows a modification of the first embodiment in which the PLL-circuit of FIG. 1 is replaced by a digital control loop or regulator circuit.

As an alternative possibility, the PLL-circuit can be replaced by a digital control loop or regulating circuit according to FIG. 2. In this case, the actual value of the frequency of the local oscillator signal proceeding from the LC oscillator is constantly measured by a frequency counter 20 using the reference oscillator signal and is subsequently supplied to a control unit 21. The control unit 21 is preferably formed by a digital computer, that is, for example, by a microcontroller or a signal processor. Based on the constantly measured actual frequency value, the control unit 21 generates suitable control voltages via a regulating algorithm by a digital-to-analog converter 22, these control voltages being applied to the capacitance diode 3, so that the resonant frequency adopts a predetermined, stabilized reference value. Fluctuations in the LC resonator values, depletion layer capacitance $C_{APD}$ and inductance L are accordingly compensated by a capacitance C of the capacitance diode 3 which is changed by the regulating algorithm via the control voltage.

An unregulated system is also possible. In that case, the resonant frequency is roughly adjusted via the control voltage of the capacitance diode 3 which is generated by the control unit 21 with the digital-to-analog converter 22; this can be based on tabular values, for example. Variations in the resonant frequency are not compensated, i.e., no regulating algorithms are used. Often, the adjusted frequency value need only correspond approximately to a predetermined reference value, i.e., small, constant deviations from the reference value, but also time variations, are allowed. However, the instantaneous value of the resonant frequency and local oscillator frequency at a defined point in time must often be known exactly for subsequent calculations. Therefore, the actual frequency value is measured and supplied to the control unit 21.

Figure 3:
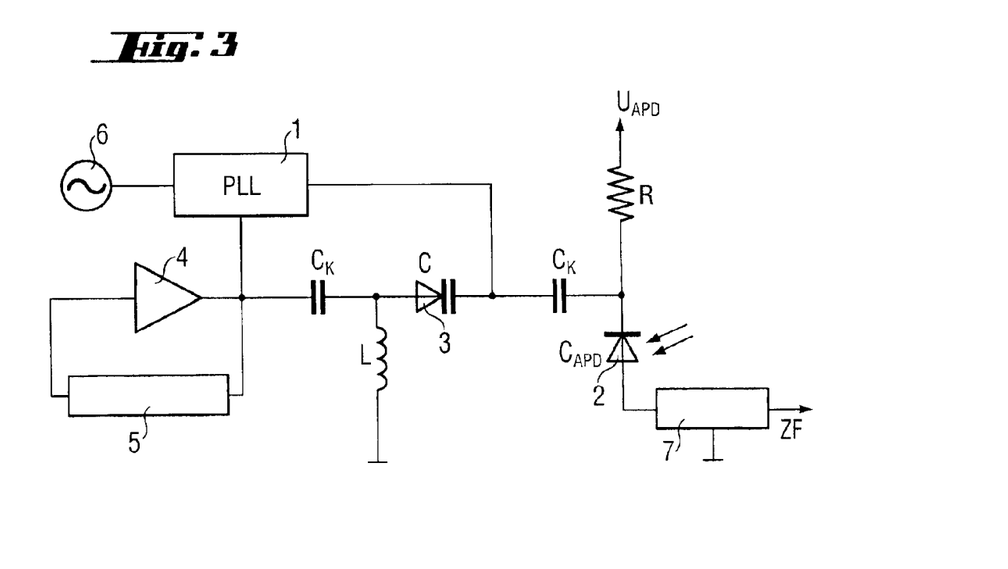
FIG. 3 shows a second embodiment of a local oscillator according to the invention based on an LC parallel resonant circuit with a capacitance diode connected in series with the depletion layer capacitance of the APD.

FIG. 3 shows a variant of the LC oscillator. In this connection, the capacitance C of the capacitance diode 3 is connected in series with the depletion layer capacitance of the APD 2. Along with the inductance L, this series connection forms a parallel resonant circuit. The anode of the capacitance diode 3 is connected to 0 volts, i.e., to ground, with respect to DC voltage via the inductance L. The positive control voltage of the PLL-circuit 1 is again supplied to the cathode of the capacitance diode 3.

Figure 4:
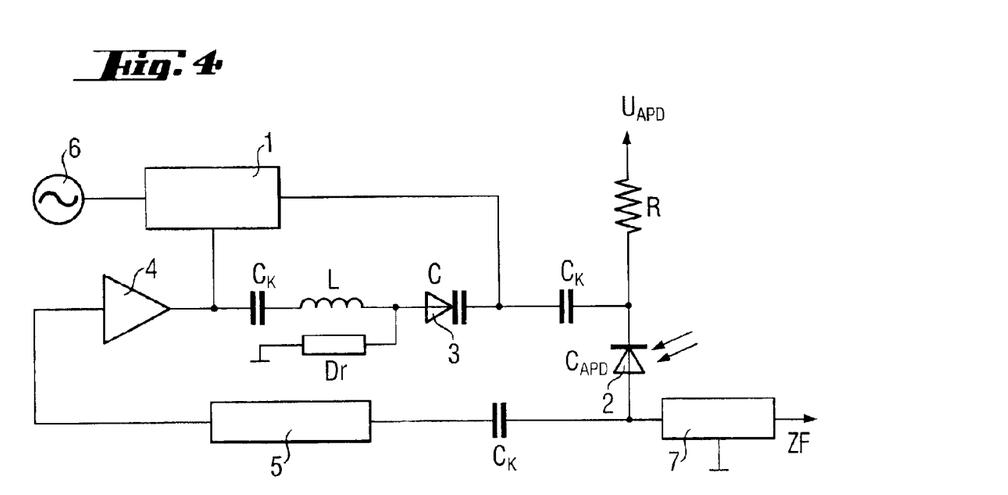
FIG. 4 shows a third embodiment of the local oscillator according to the invention based on an LC series resonant circuit.

FIG. 4 shows another series resonant circuit comprising inductance L, capacitance C of the capacitance diode and the APD depletion layer capacitance $C_{APD}$. The anode of the capacitance diode 3 is connected to ground potential with respect to DC voltage via a choke Dr.

The advantage of the arrangements according to FIGS. 3 and 4 consists in that with the necessary, relatively large diode capacitances C (e.g., 10-times greater than $C_{APD}$) the voltage amplitude across the capacitance diode 3 is lower than in the circuit according to FIG. 1 or FIG. 2. With large amplitudes, the capacitance diode 3 in a half-wave of the local oscillator signal is connected in the forward conducting direction. In this way, the amplitude is limited and strong harmonic wave components occur in the local oscillator signal. Therefore, in order to reduce the amplitude at the capacitance diode in the embodiment example in FIG. 1, another capacitance (not shown) must generally be connected in series with the diode capacitance C in addition. This corresponds to a capacitive voltage divider. However, as a result of this step, the effective capacitance of this series connection is small, so that the tunable frequency range of the resonant circuit is also limited.

Especially in the arrangement in FIG. 4, it turns out to be advantageous that the parasitic inductive components of the APD 2, capacitance diode 3 and coupling capacitors which proceed from the leads are likewise incorporated in the LC resonant circuit. Accordingly, since there are fewer spurious or secondary resonances, this has a positive effect on the tuning range.

In the arrangements according to FIGS. 3 and 4, care must be taken that the variable range of the effective resonator capacitance, i.e., the series connection of C and $C_{APD}$, can be very small as in the circuit according to FIG. 1 due to the series connection of the variable capacitance C of the capacitance diode 3 and the depletion layer capacitance $C_{APD}$ of the APD 2 because of the small depletion layer capacitance of, e.g., 2 pF. The frequency tuning range of the resonant circuit is accordingly limited. In addition, the amplitude of the voltage at the APD 2 is dependent on the control voltage of the PLL due to the capacitive voltage divider comprising C and $C_{APD}$ due to the variable capacitance C.

Figure 5:
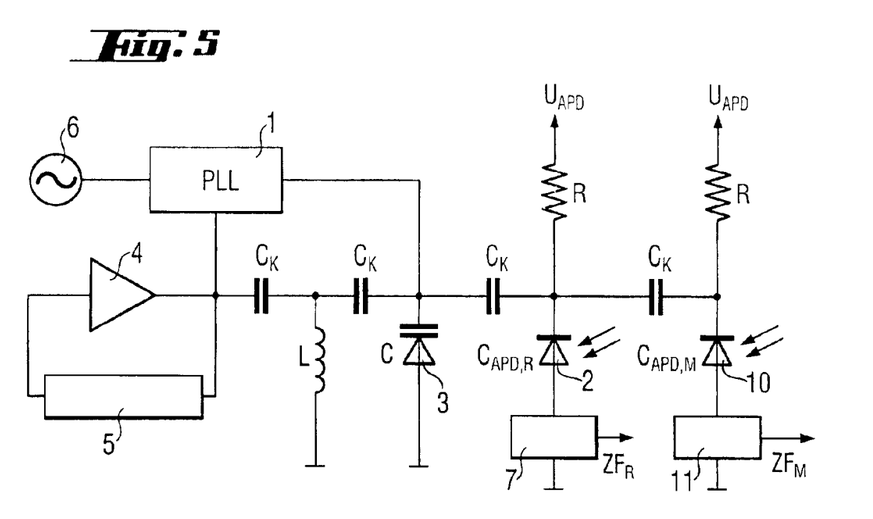
FIG. 5 shows a fourth embodiment of a PLL-stabilized LC oscillator according to the invention in which there are two APDs which are high-frequency connected in parallel and which are incorporated in an LC parallel resonant circuit.

FIG. 5 shows another supplemented variant of the basic circuit arrangement according to FIG. 1. In this circuit arrangement, the described PLL-stabilized LC oscillator is formed by an HF-signal parallel connection of a first depletion layer capacitance $C_{APD,R}$ of the APD 2 which in this case serves as a reference receiver of an optoelectronic distance measurement device, the depletion layer capacitance $C_{APD,M}$ of an APD 10 used as a measurement signal receiver, the capacitance C of the capacitance diode 3 and the inductance L. The APD 2 of the reference receiver receives the sinusoidal intensity-modulated light emitted by a laser diode transmitter (not shown) directly after traversing a reference path with a known optical path length. The APD 10 of the measurement receiver detects the intensity-modulated light which is backscattered from the remote measurement object and which is likewise sinusoidal. The two electric signals generated in the APDs 2, 10 are converted by direct mixing with the local oscillator signal proceeding from the LC oscillator in the (comparatively) low-frequency intermediate frequency range. The IF reference signal $IF_R$ and the IF measurement signal $IF_M$ are extracted via associated low-pass filters 7 and 11, respectively. By determining the phase difference of the two intermediate frequency signals, the distance to be measured can be determined. Phase errors generated by the laser diode transmitter are eliminated by this subtraction. In this connection, reference is had to the optoelectronic distance measurement device which was already mentioned and which is described in DE Patent Application 100 06 493.0.

Figure 6:
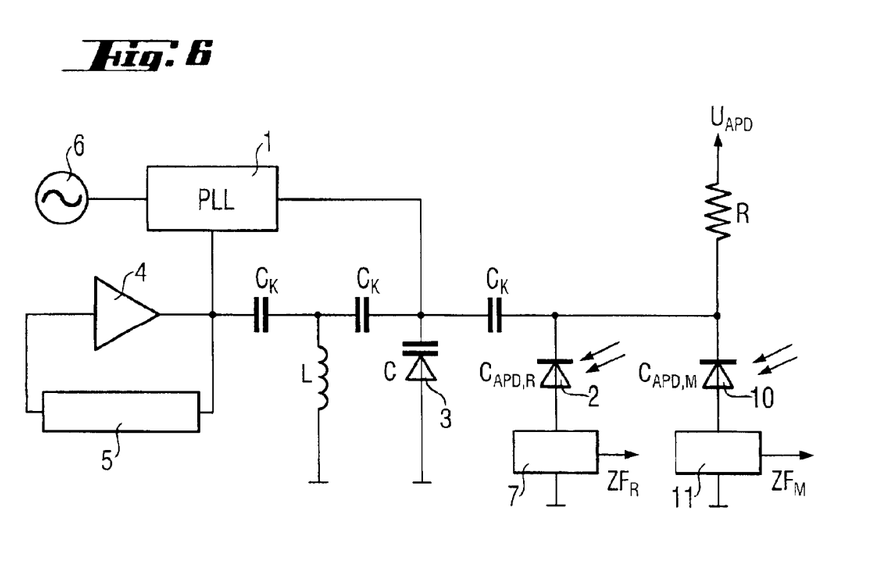
FIG. 6 shows a fifth embodiment of a PLL-stabilized LC oscillator in which two APDs are connected in parallel with respect to high frequency and DC voltage.

If it is not necessary for the gain factors of the APD 10 of the measurement receiver and APD 2 of the reference receiver to be adjustable separately by their depletion layer voltages, the two APDs according to the embodiment example in FIG. 6 can be connected in parallel with respect to the HF signal as well as with respect to DC voltage.

In the circuit arrangement according to FIGS. 5 and 6, it is very important that the common voltage signal of the local oscillator is transmitted to the respective depletion layers of the APDs 2, 10 in phase in that the APD 10 of the measurement branch and the APD 2 of the reference branch are connected in parallel with respect to HF signal in case the bulk resistances of the APDs are negligible. Since the bulk resistances in silicon APDs are generally less than 0.1 Ω, this precondition is also given in practice. The phase of the local oscillator signal is influenced only by the sum capacitance of the parallel circuit C∥ $C_{APD,R}$∥$C_{APD,M}$ and not by the individual depletion layer capacitances of the APDs 2, 10 which are dependent on environmental influences and specimen scatter. In direct mixing, the mixing process takes place in the internal power source of the respective APD, so that the high-frequency reception signal is also not influenced by the depletion layer capacitance of the respective APD and other external parasitic capacitances. In addition, the frequency of the frequency-converted IF signal is so low that the depletion layer capacitance which is dependent on environmental conditions and specimen scatter plays no part in this respect. Since, in this case, the APD 10 of the measurement branch and the APD 2 of the reference branch are acted upon by the same local oscillator and variations in the sum capacitance have the same effect for both branches, error compensation can be achieved within certain limits by subtracting the phases of the respective IF signals. However, a very exact compensation is impossible because the coupling capacitors and the connection capacitances of the APDs imply further—although only very small—phase errors for the local oscillator signal. Changes in phase in the reception signal which occur as a result of different drift times of the charge carrier in the depletion layer of the respective APD can not be compensated. However, a considerable phase error source, i.e., the behavior of the depletion layer capacitances, can be eliminated through the use of the circuit arrangement according to FIGS. 5 and 6, so that an error reduction is achieved particularly in the optoelectronic distance measurement.

However, it is also advantageous that this applies only to the high-frequency signals of the circuit and not to the few critical low-frequency IF signals, for which parasitic capacitances are usually negligible. However, for amplification, intermediate frequency amplifiers are generally used in the measurement branch and reference branch. With widely different signal amplitudes, the amplifications are also selected differently when necessary, so that the signal phases in both branches can be influenced differently. Specimen scatter between the IF-amplifiers (not shown) can produce additional errors. These phase errors must then either be taken into account computationally or can be eliminated automatically by the arrangement as is described in DE Patent Application 100 06 493.0.

It is particularly advantageous that the inductance L for the IF signal constitutes a good short circuit, so that crosstalk of the IF signals from the reference signal branch to the measurement signal branch is sharply reduced. In this connection, it is not so much the compensation of capacitances by the respective capacitance diode and LC resonant circuit that is important, as the fact that both APD depletion layers are acted upon with a local oscillator signal of the same phase by the parallel connection according to the invention, that is, that phase variations can be compensated by subtraction. In this connection, compensation of capacitances is only significant for generating the constant resonant frequency.

Figure 7:
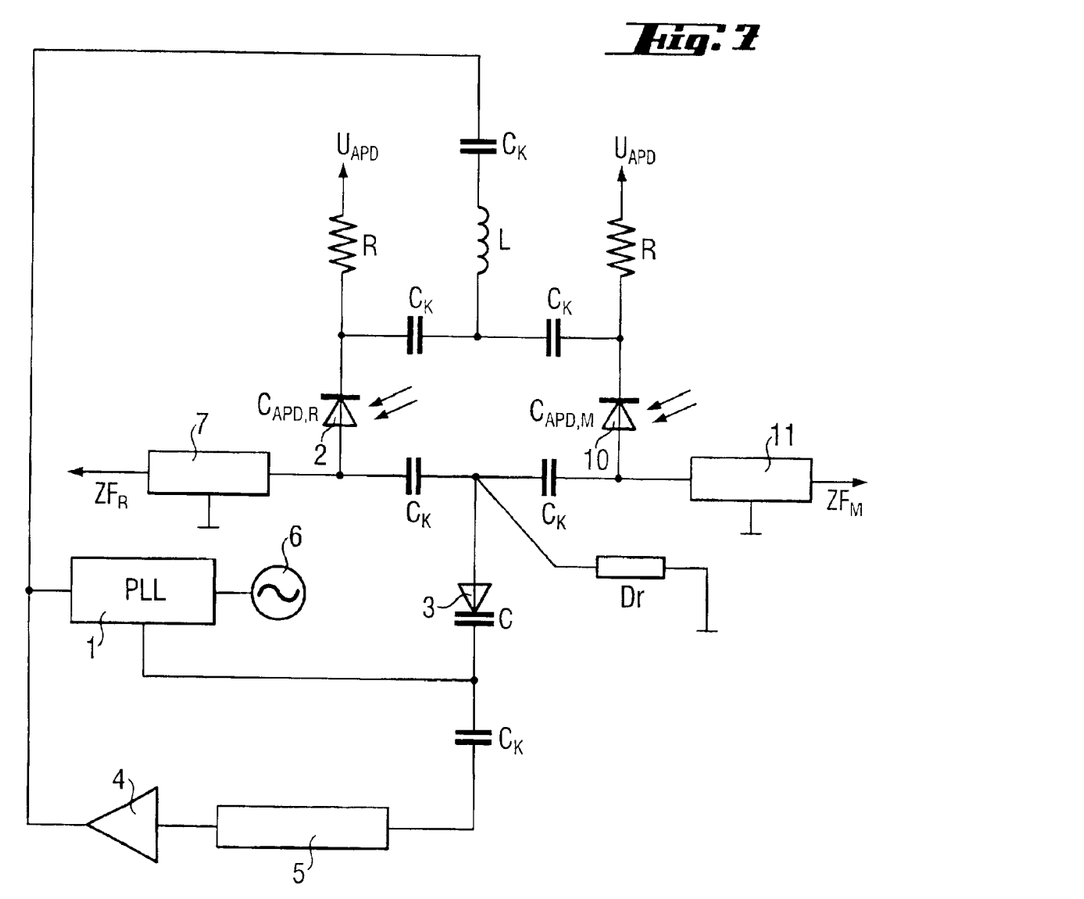
FIG. 7 shows a sixth embodiment of a PLL-stabilized LC oscillator in which two APDs are connected in parallel with respect to high frequency and are incorporated in an LC series resonant circuit.

In the embodiment example according to FIG. 7, the depletion layer capacitances $C_{APD,R}$ and $C_{APD,M}$ of the avalanche photodiodes 2 and 10, for example, a reference receiver and measurement receiver, which are connected in parallel with respect to HF signals are incorporated in an LC series resonant circuit. The LC circuit is formed by the inductance L through the capacitance C of the capacitance diode 3 connected in series with L and by the sum capacitance $C_{APD,R}+C_{APD,M}$ of the parallel-connected APDs 2, 10 which is connected in series with L. The coupling capacitances $C_K$ are again HF-signal short circuits. The low-pass filters 7 and 11 serve to decouple the IF signals of the measurement channel and reference channel and generate a DC voltage component of virtually 0 volts at the anodes of the APDs 2, 10 in that a connection to ground is produced via a relatively high-impedance resistance. The low-pass filters 7, 10 do not pass the HF signals, i.e., the reception signals of the APDs 2, 10, or the local oscillator signal proceeding from the LC oscillator. The amplifier 4 together with the feedback network 5 in turn leads to a stable operation of the LC oscillator with constant amplitude. The resonant frequency is also regulated in this example in the manner described above by the PLL-circuit 1 by influencing the blocking voltage at the capacitance diode 3. The anode of the capacitance diode is connected to earth, i.e., grounded, with respect to DC voltage via the choke Dr. The choke Dr does not pass the HF signals and constitutes a short circuit for the low-frequency IF signals, so that crosstalk of IF signals from the reference signal branch to the measurement signal branch is also sharply reduced in this case. The coupling capacitances $C_K$ are high impedance for the low-frequency IF signals. If it is not necessary for the gain factors of the APD 10 of the measurement receiver and the APD 2 of the reference receiver to be adjustable separately by their depletion layer voltages, the two APDs 2, 10 can be connected in parallel with respect to DC voltage similar to FIG. 6 in that the coupling capacitances at the cathodes of the APDs 2, 10 are replaced in FIG. 7 by conducting connections.

Figure 8:
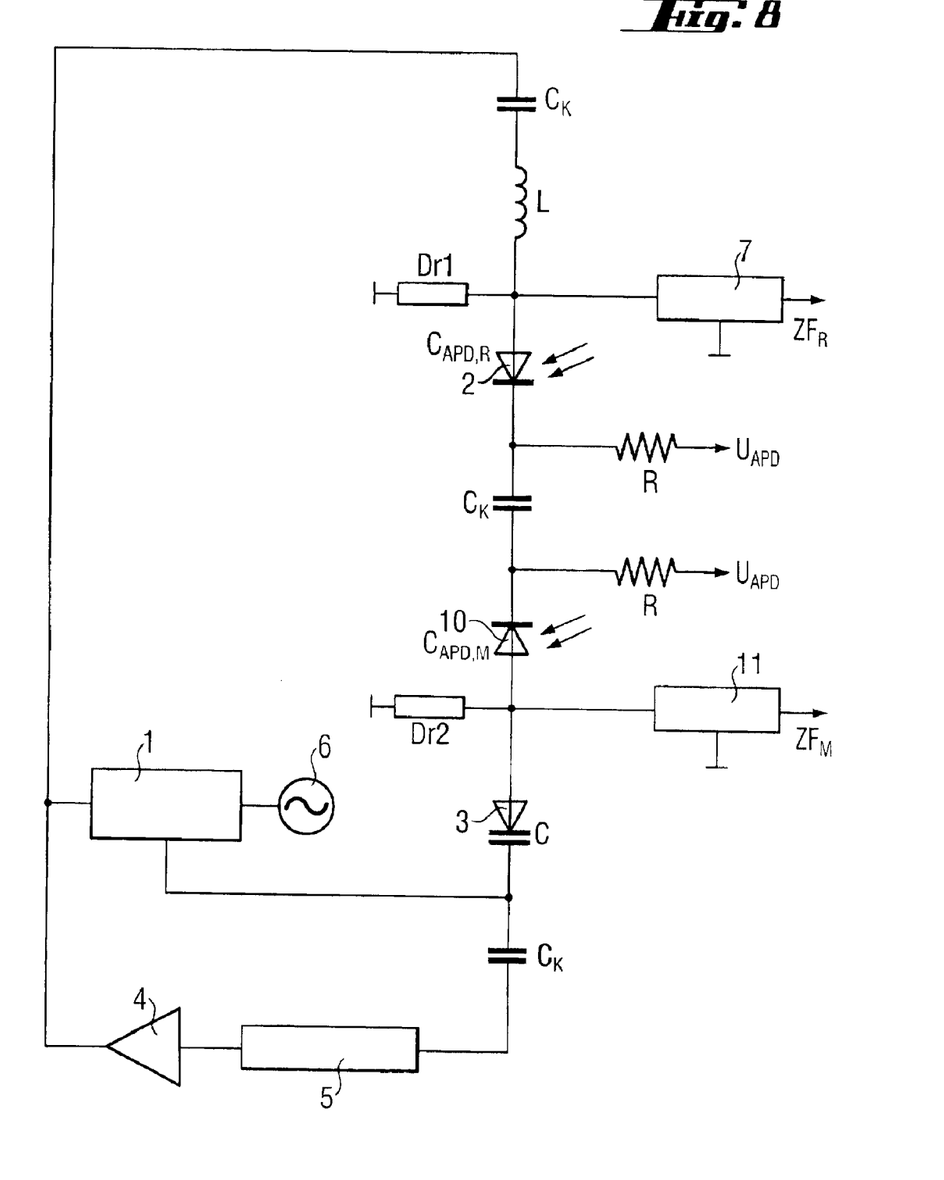
FIG. 8 shows a seventh embodiment of a PLL-stabilized LC oscillator in which two APDs are connected in series with respect to high frequency and are incorporated in an LC series resonant circuit.

In the embodiment example according to FIG. 8, the depletion layer capacitances $C_{APD,R}$ and $C_{APD,M}$ of the avalanche photodiodes 2 and 10, for example, of the reference receiver and measurement receiver, which avalanche photodiodes 2, 10 are connected in series with respect to HF signals, are incorporated in an LC series resonant circuit. This circuit comprises inductance L, the capacitance C of the capacitance diode 3 which is connected in series with L, and the capacitances $C_{APD,R}$ and $C_{APD,M}$ of the APDs 2, 10 which are connected in series with L. The coupling capacitances $C_K$ are again short circuits for the HF signals. The low-pass filters 7 and 11 serve to decouple the IF signals of the measurement channel and reference channel. They do not pass the HF signals, i.e., the reception signals of the APDs 2, 10, or the local oscillator signal proceeding from the LC oscillator. The amplifier 4, together with the feedback network 5, brings about a stable operation of the oscillator with constant amplitude. The resonant frequency is also regulated in this example by the PLL-circuit 1 by influencing the blocking voltage at the capacitance diode 3. The anode of the capacitance diode 3 and the anodes of APDs 2 and 10 are connected to earth, i.e., grounded, with respect to DC voltage via the chokes Dr1 and Dr2. The chokes do not pass the HF signals and, for the low-frequency IF signals, represent a short circuit, so that crosstalk of IF signals from the reference signal branch to the measurement signal branch is also sharply reduced. The coupling capacitances $C_K$ have a high impedance for the low-frequency IF signals. If it is not necessary for the gain factors of the APD 10 of the measurement receiver and of the APD 2 of the reference receiver to be adjustable separately by their depletion layer voltages, the cathodes of the two APDs 2, 10 can also be connected with respect to DC voltage in that the coupling capacitance between them in FIG. 8 is replaced by a conducting connection.

The advantages and disadvantages of the variants in FIGS. 7 and 8 compared with the embodiment form of the invention according to FIG. 6 have already been discussed in detail in the description of the corresponding embodiment examples in FIGS. 3 and 4. One advantage consists in the lower voltage amplitudes across the capacitance diode 3. Moreover, especially in the arrangement in FIG. 8, the parasitic inductive components of the APDs 2, 10, capacitance diode 3 and coupling capacitors $C_K$ are a part of the LC resonant circuit, so that scant secondary resonances occur. However, it is to be noted in the arrangements according to FIGS. 7 and 8 that the variable range of the effective resonator capacitance can be small due to the series connection of the capacitance diode 3 with the depletion layer capacitances of the APDs 2, 10 because of the small APD capacitance of, e.g., 2 pF, so that the frequency tuning range of the resonant circuit is limited. Further, the amplitude of the APD voltage is dependent on the control voltage of the PLL-circuit 1 due to the capacitive voltage divider and the variable capacitance C of the capacitance diode 3. Further, care should be taken in the variant in FIG. 8 that the local oscillator signal is transmitted asymmetrically to the respective APDs 2, 10 in case of different depletion layer capacitances $C_{APD,R}$ and $C_{APD,M}$. Accordingly, specimen scatter and environmental influences are not compensated to the same extent as in the other examples. In addition, the voltage amplitudes at the respective APDs 2, 10 are halved by the series connection of the APD depletion layer capacitances due to the capacitive voltage divider proceeding from the latter. However, the amplitude of the LO signal should be as high as possible for highly efficient direct mixing.

There are other possible connection combinations for producing an LC resonant circuit. For example, a parallel resonant circuit comprising an inductance and the series connection of a capacitance diode with series-connected APD depletion layer capacitances can be used. Also, a parallel resonant circuit comprising an inductance and the series connection of a capacitance diode with parallel-connected APD depletion layer capacitances would also be possible. Depending on the application, the APDs can be connected with respect to high-frequency signals or DC voltage. Naturally, in all embodiment examples, the digital control unit according to FIG. 2 can also be used instead of the PLL-regulated local oscillators, wherein a regulated or unregulated system is possible according to the description of FIG. 2.

A substantial advantage of the circuit of a local oscillator according to the invention results in the following manner:

An APD is a current source supplying an internally generated photocurrent. The depletion layer capacitance of the APD is connected in parallel with this current source. At high frequencies, the signal is short-circuited by this depletion layer capacitance, so that a low-pass behavior results. Also, the local oscillator signal "sees" this depletion layer capacitance and is likewise short-circuited to ground by it. However, this is only the case when the local oscillator signal is supplied, e.g., via an amplifier. In the descried case and according to the invention in which the local oscillator signal is formed by the LC resonant circuit itself, the capacitive influence, and accordingly also the low-pass behavior originating from the respective depletion layer capacitance, is eliminated, i.e., tuned out, by the parallel-connected or series-connected inductance L. The depletion layer capacitance is integrated in the resonant circuit and, therefore, can no longer generate any low-pass behavior. The low-pass behavior is now only formed by the drift times of the generated charge carriers within the semiconductor.

A local oscillator with features according to the invention is accordingly distinguished by the following advantageous characteristics:

- possible interference due to crosstalk and specimen scatter of external electromagnetic interference outputs are low due to the possibly very small structures;
- there are no high-frequency signals, high-frequency components or high-frequency structures in the path of the reception signal, for example, a measurement signal, since the measurement signal or the APD reception signal are narrow-band;
- the output signals generated by the APD or APDs are low-frequency, i.e., for example, in the range of 10 kHz to 100 kHz, and can accordingly be further processed without difficulty and amplified with low noise; there are no problems with any matching that may be needed, nor with the structural size of component groups, emission, crosstalk, EMI or other parasitic effects;
- fewer component parts are required and, therefore, system costs are also reduced in principle;
- power consumption is appreciably reduced in comparison with known solutions with high-frequency transmission or systems with necessary impedance matching;
- output losses with the respective APD cathode are low due to the idling operation with high voltage amplitude at the LC resonator circuit;
- possible interfering environmental influences, such as temperature, sharply fluctuating reception output, varying depletion layer voltage and specimen scatter, on signal phase behavior are automatically compensated by eliminating parasitic capacitance;
- a defined system state is automatically adjusted in the reception part and signal processing part regardless of specimen scatter and possible environmental influences;
- when the invention is applied in an optoelectronic distance measurement device, the measurement accuracy is appreciably improved;
- automatic elimination of the low-pass-limiting behavior by tuning out circuit capacitances independent from environmental influences and specimen scatter;
- a defined local oscillator frequency can be ensured which is independent from possible specimen scatter and environmental influences;
- the local oscillator frequency and the signal phase behavior depend only on the frequency of the reference oscillator and the divider ratio of the PLL-circuit;
- different phase times and running times are eliminated in case of an optoelectronic distance measurement device in the measurement receiver and reference receiver by the HF-signal parallel connection of the reference APD and LC resonant circuit.

Though the present invention was shown and describe with reference to the preferred embodiments, it is not intended that the present invention be limited to the disclosed embodiments and/or details thereof, and the present invention includes all variations and/or alternative embodiments within the spirit and scope of the present invention as defined by the appended claims.

What is claimed is:

1. Local oscillator for generating a narrow-band HF signal for direct mixing with a reception signal generated by a reverse-biased avalanche photodiode (APD 2) from a light signal impinging on the latter, wherein a depletion layer capacitance ($C_{APD}$) of the avalanche photodiode (APD 2) is incorporated in a controllable HF resonant circuit whose circuit whose resonant frequency forming the HF signal is determined by selective adjustments of a control unit which is acted upon by a reference oscillator (6).

2. Local oscillator according to claim 1, wherein a control unit is a PLL-circuit (1) for frequency regulation and phase regulation, whose adjustable divider ratio, together with a frequency of the reference oscillator (6), determines the frequency of the HF resonant circuit.

3. Local oscillator according to claim 2, wherein the control unit is a digital calculating unit which adjusts the frequency of the HF resonant circuit with control signals generated by the calculating unit and determines an actual value of the frequency of the HF resonant circuit based on the frequency of the reference oscillator.

4. Local oscillator according to claim 3, wherein the digital calculating unit determines the reference value of the frequency of the HF resonant circuit based on the frequency of the reference oscillator (6) and the determined actual value of the frequency of the HF resonant circuit via a regulator and control signals generated by the digital calculating unit.

5. Local oscillator according to claim 4, wherein the regulator is realized by a computing program.

6. Local oscillator according to claim 2, wherein the HF resonant circuit is a HF resonant circuit with a controllable capacitance (C), the HF resonant circuit being connected in parallel or in series with the depletion layer capacitance ($C_{APD}$).

7. Local oscillator according to claim 6, wherein the controllable capacitance is a capacitance diode (3).

8. Local oscillator according to claim 2, wherein the HF resonant circuit is a HF resonant circuit with a controllable inductance and connected in parallel or in series with the depletion layer capacitance ($C_{APD}$).

9. Local oscillator according to claim 2, wherein the HF resonant circuit is formed by a resonator and at least one of controllable capacitance and controllable inductance, together with the depletion layer capacitance ($C_{APD}$) of the avalanche photodiode (APD 2).

10. Local oscillator according to claim 9, wherein the resonator is one of an LC series resonant circuit and an LC parallel resonant circuit.

11. Local oscillator according to claim 9, wherein the resonator is a cavity resonator.

12. Local oscillator according to claim 9, wherein the resonator is a conducting resonator.

13. Local oscillator according to claim 9, wherein the resonator is one of a quartz resonator and a SAW (surface acoustic wave) resonator.

14. Local oscillator according to claim 9, wherein the resonator is a dielectric ceramic resonator.

15. Local oscillator according to claim 2, further including a feedback amplifier (4, 5) connected with the HF resonant circuit for compensating losses and for maintaining an oscillation of constant amplitude of the HF resonant circuit.

16. Local oscillator according to claim 1, including a low-pass (7) connected with a mixing signal output of the avalanche photodiode and which has a cutoff frequency above a desired IF signal.

17. Local oscillator according to claim 1, wherein another avalanche photodiode (APD 10), which is likewise reverse-biased and enerates a second reception signal to be converted by direct mixing into another frequency range, and a depletion layer capacitance ($C_{APD,M}$) of which is connected in parallel with the depletion layer capacitance ($C_{APD,R}$) of the first avalanche photodiode (APD 2) and with a LC resonant circuit.

18. Local oscillator according to claim 1, wherein another avalanche photodiode (APD 10), which is likewise reverse-biased and which generates a second reception signal to be converted by direct mixing into another frequency range, and a depletion layer capacitance ($C_{APD,M}$) of which is connected in parallel with the depletion layer capacitance ($C_{APD,R}$) of the first avalanche photodiode (APD 2), wherein a total capacitance ($C_{APD,M}+C_{APD,R}$) of the parallel circuit is connected in series with a LC series resonant circuit.

19. Local oscillator according to claim 1, wherein another avalanche photodiode (APD 10), which is likewise reverse-biased and generates a second reception signal to be converted by direct mixing into another frequency range, and depletion layer capacitance ($C_{APD,M}$) of which is connected in series with a depletion layer capacitance ($C_{APD,R}$) of the first avalanche photodiode (APD 2) and with a LC series resonant circuit.

20. Local oscillator according to claim 1, wherein another avalanche photodiode (APD 10) which is likewise reverse-biased and generates a second reception signal to be converted by direct mixing into another frequency range, and a depletion layer capacitance ($C_{APD,M}$) of which is connected in series with the depletion layer capacitance ($C_{APD,R}$) of the first avalanche photodiode (APD 2), wherein a total capacitance of the series circuit is connected in parallel with a LC parallel resonant circuit.

* * * * *

UNITED STATES PATENT AND TRADEMARK OFFICE
CERTIFICATE OF CORRECTION

PATENT NO. : 6,950,639 B2  Page 1 of 1
APPLICATION NO. : 09/911272
DATED : September 27, 2005
INVENTOR(S) : Torsten Gogolla et al.

It is certified that error appears in the above-identified patent and that said Letters Patent is hereby corrected as shown below:

Title Page, item {73} Assignees: add Hilti Aktiengesellschaft, Schaan (LI)
Jenoptik Aktiengesellschaft, Jena (DE)

Signed and Sealed this

Fourteenth Day of November, 2006

JON W. DUDAS
*Director of the United States Patent and Trademark Office*